(12) United States Patent
Bruce et al.

(10) Patent No.: US 6,821,641 B2
(45) Date of Patent: Nov. 23, 2004

(54) ARTICLE PROTECTED BY THERMAL BARRIER COATING HAVING A SINTERING INHIBITOR, AND ITS FABRICATION

(75) Inventors: Robert William Bruce, Loveland, OH (US); Nicholas Hamilton Burlingame, Belmont, NY (US)

(73) Assignee: General Electric Company, Schenectady, NY (US)

(*) Notice: Subject to any disclaimer, the term of this patent is extended or adjusted under 35 U.S.C. 154(b) by 64 days.

(21) Appl. No.: 10/086,150

(22) Filed: Oct. 22, 2001

(65) Prior Publication Data

US 2003/0077477 A1 Apr. 24, 2003

(51) Int. Cl.[7] ............................ B32B 15/04; F03B 3/12; C23C 16/00
(52) U.S. Cl. ........................ 428/633; 428/670; 428/680; 428/699; 428/701; 428/702; 427/596; 427/255.29; 427/255.32; 416/241 B
(58) Field of Search ................................. 428/632, 633, 428/650, 670, 680, 655, 469, 699, 709, 702, 615, 621, 678, 687; 427/596, 255.29, 255.32; 416/241 B

(56) References Cited

U.S. PATENT DOCUMENTS

| | | |
|---|---|---|
| 5,562,998 A | 10/1996 | Strangman |
| 5,624,721 A | 4/1997 | Strangman |
| 5,876,860 A * | 3/1999 | Marijnissen et al. |
| 5,906,895 A | 5/1999 | Hamada et al. |
| 6,060,177 A | 5/2000 | Bornstein et al. |
| 6,103,386 A | 8/2000 | Raybould et al. |
| 6,203,927 B1 | 3/2001 | Subramanian et al. |
| 6,258,467 B1 | 7/2001 | Subramanian |
| 6,296,945 B1 * | 10/2001 | Subramanian |
| 6,440,575 B1 * | 8/2002 | Heimberg et al. |

FOREIGN PATENT DOCUMENTS

| | | |
|---|---|---|
| EP | 0 783 043 A1 | 7/1997 |
| EP | 1 225 251 A2 | 7/2002 |
| WO | WO 01/18274 A1 | 3/2001 |
| WO | WO 01/18277 A1 | 3/2001 |
| WO | WO 01/23642 A2 | 4/2001 |
| WO | WO 02/27066 A2 | 4/2002 |

* cited by examiner

Primary Examiner—Jennifer McNeil
(74) Attorney, Agent, or Firm—McNees Wallace & Nurick LLC

(57) ABSTRACT

An article protected by a thermal barrier coating system includes a substrate having a substrate surface, and a thermal barrier coating system overlying the substrate. The thermal barrier coating system has a thermal barrier coating formed of a thermal barrier coating material arranged as a plurality of columnar grains extending generally perpendicular to the substrate surface and having grain surfaces. A sintering inhibitor is within the columnar grains, either uniformly distributed or concentrated at the grain surfaces. The sintering inhibitor is lanthanum oxide, lanthanum chromate, chromium oxide, and/or yttrium chromate, mixtures thereof, mixtures thereof with aluminum oxide, modifications thereof wherein cobalt or manganese is substituted for chromium, precursors thereof, and reaction products thereof.

16 Claims, 4 Drawing Sheets

ARTICLE PROTECTED BY THERMAL BARRIER COATING HAVING A SINTERING INHIBITOR, AND ITS FABRICATION

This invention relates to the thermal barrier coating used to protect an article such as a nickel-base superalloy substrate and, more particularly, to the inhibiting of the sintering between the grains of the thermal barrier coating.

BACKGROUND OF THE INVENTION

A thermal barrier coating system may be used to protect the components of a gas turbine engine that are subjected to the highest temperatures. The thermal barrier coating system usually includes a bond coat that is deposited upon a superalloy substrate, and a ceramic thermal barrier coating that is deposited upon the bond coat. The thermal barrier coating acts as a thermal insulator against the heat of the hot combustion gas. The bond coat bonds the thermal barrier coating to the substrate and also inhibits oxidation and corrosion of the substrate.

The currently preferred thermal barrier coating is yttria-stabilized zirconia (YSZ), which is zirconia (zirconium oxide) with from about 2 to about 12 percent by weight yttria (yttrium oxide) added to stabilize the zirconia against phase changes that otherwise occur as the thermal barrier coating is heated and cooled during fabrication and service. The YSZ is deposited by a physical vapor deposition process such as electron beam physical vapor deposition. In this deposition process, the grains of the YSZ form as columns extending generally outwardly from and perpendicular to the surfaces of the substrate and the bond coat.

When the YSZ is initially deposited, there are small gaps between the generally columnar grains. On examination at high magnification, the generally columnar grains are seen to have a somewhat feather-like morphology characterized by these gaps oriented over a variety of angles relative to the substrate surface. The gaps serve to accommodate the transverse thermal expansion strains of the columnar grains and also act as an air insulator in the insulator structure. As the YSZ is exposed to elevated temperatures during service, these gaps gradually close by a sintering mechanism. As a result, the ability of the YSZ to accommodate thermal expansion strains gradually is reduced, and the thermal conductivity of the YSZ gradually increases by about 20 percent or more. The as-deposited thickness of the YSZ must therefore be greater than would otherwise be desired, to account for the loss of insulating power associated with this rise in thermal conductivity during service.

It has been recognized that the addition of sintering inhibitors to the YSZ reduces the tendency of the gaps between the columnar grains to close by sintering during service of the thermal barrier coating. A number of sintering inhibitors have been proposed. However, these sintering inhibitors have various shortcomings, and there is a need for more effective sintering inhibitors. The present invention fulfills this need, and further provides related advantages.

BRIEF SUMMARY OF THE INVENTION

The present invention provides an article protected by a thermal barrier coating system, and a method for its fabrication. The thermal barrier coating includes effective sintering inhibitors that slow or prevent the closure of the gaps between the columnar grains. The sintering inhibitors are readily introduced into the thermal barrier coating by an infiltration technique or by co-evaporation, preferably from an ingot that contains the sintering inhibitors.

An article protected by a thermal barrier coating system comprises a substrate having a substrate surface, and a thermal barrier coating system overlying the substrate. The thermal barrier coating system comprises a thermal barrier coating formed of a thermal barrier coating material arranged as a plurality of columnar grains extending generally perpendicular to the substrate surface and having grain surfaces, and a sintering inhibitor within the columnar grains. The sintering inhibitor may be uniformly distributed within the columnar grains or concentrated at the grain surfaces. The sintering inhibitor is selected from the group consisting of lanthanum oxide, lanthanum chromate, chromium oxide, and yttrium chromate, mixtures thereof, mixtures thereof with aluminum oxide, modifications thereof wherein cobalt or manganese is substituted for chromium, precursors thereof, and reaction products thereof. These are the "forms" of the sintering inhibitor. Preferably, a bond coat is disposed between the substrate and the thermal barrier coating. The bond coat may be a diffusion aluminide or an aluminum-containing overlay coating, and is most preferably a platinum aluminide.

The substrate is preferably a nickel-base superalloy in the form of a component of a gas turbine engine. Examples include a turbine blade, a turbine vane, and combustor components such as fuel nozzles and shields.

A method for fabricating an article protected by a thermal barrier coating system comprises the steps of providing a substrate having a substrate surface, and applying a thermal barrier coating system overlying the substrate. The thermal barrier coating system comprises a thermal barrier coating formed of a thermal barrier coating material arranged as a plurality of columnar grains extending generally perpendicular to the substrate surface and having grain surfaces, and a sintering inhibitor within the columnar grains. The sintering inhibitor is selected from the group consisting of lanthanum oxide, lanthanum chromate, chromium oxide, and yttrium chromate, mixtures thereof, mixtures thereof with aluminum oxide, modifications thereof wherein cobalt or manganese is substituted for chromium, precursors thereof, and reaction products thereof. These are the "forms" of the sintering inhibitor.

In one embodiment, the thermal barrier coating is deposited, and thereafter the sintering inhibitor is infiltrated into the thermal barrier coating. In another embodiment, the thermal barrier coating material and the sintering inhibitor are co-deposited. In the various embodiments, a bond coat is preferably deposited on the substrate surface prior to depositing the thermal barrier coating.

The sintering inhibitor provides effective inhibition of the sintering that otherwise closes the gaps between the columnar ceramic grains of the thermal barrier coating during service. The result is that the ability of the thermal barrier coating to withstand the development of thermally induced stresses is retained for an extended service lifetime. The thermal conductivity of the thermal barrier coating is also maintained at a low level for an extended period. Some of the species may additionally improve the optical and thermal properties of the thermal barrier coating. Chromium oxide, for example, alters the emissivity of the thermal barrier coating in the 0.7–1 micrometer wavelength range.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
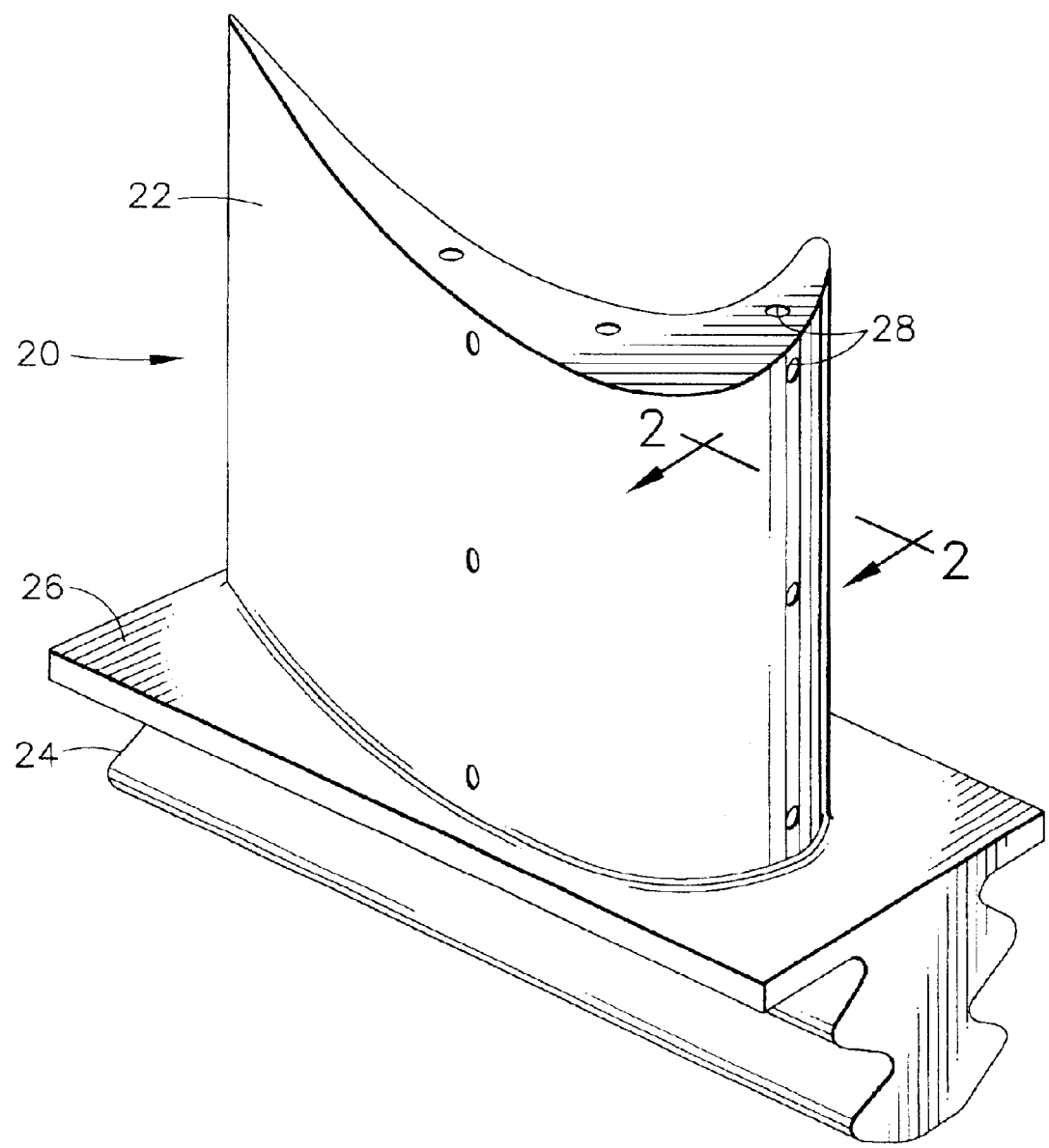
FIG. 1 is a perspective view of a gas turbine blade article having an airfoil structure.

FIG. 1 depicts a component article of a gas turbine engine such as a turbine blade or turbine vane, and in this illustration a turbine blade 20. The turbine blade 20 is formed of any operable material, but is preferably a nickel-base superalloy. The turbine blade 20 includes an airfoil section 22 against which the flow of hot exhaust gas is directed. (The turbine vane or nozzle has a similar appearance in respect to the pertinent airfoil section, but typically includes other end structure to support the airfoil.) The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of internal passages extend through the interior of the airfoil 22, ending in openings 28 in the surface of the airfoil 22. During service, a flow of cooling air is directed through the internal passages to reduce the temperature of the airfoil 22.

Figure 2:
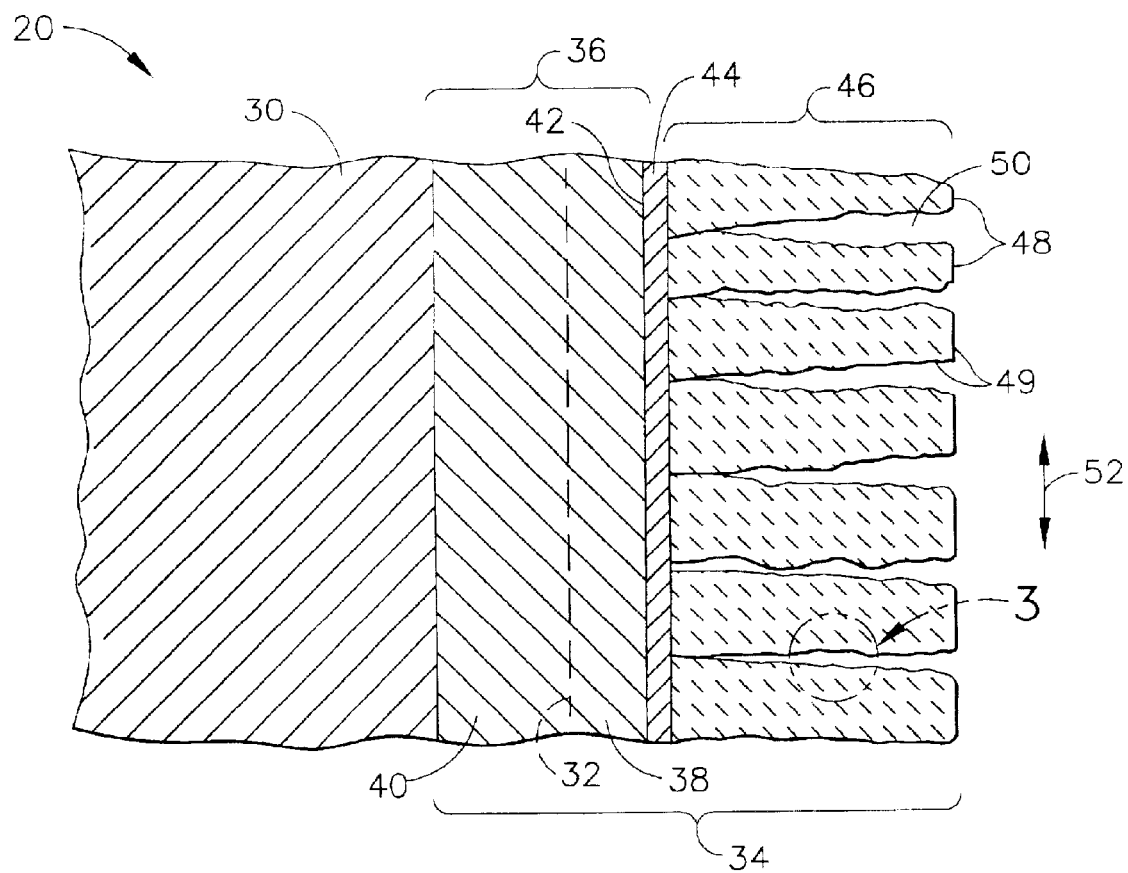
FIG. 2 is a schematic sectional view through the airfoil structure of FIG. 1, taken on lines 2-2.
Figure 3:
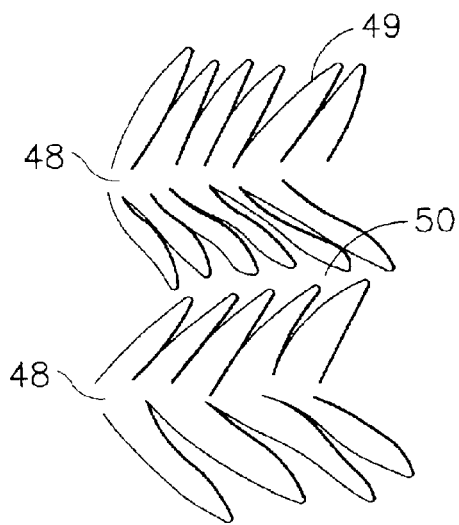
FIG. 3 is an enlarged detail of FIG. 2, taken in area 3.

FIG. 2 is a schematic sectional view, not drawn to scale, through a portion of the turbine blade 20, here the airfoil section 22, and FIG. 3 is a detail of FIG. 2 showing the feather-like structure of the columnar grains. The turbine blade 20 has a body that serves as a substrate 30 with a surface 32. Overlying and contacting the surface 32 of the substrate 30, and also extending downwardly into the substrate 30, is a thermal barrier coating system 34 including a protective coating, which in this case is termed a bond coat 36. The bond coat 36 is thin and generally planar while conforming to and being bonded to the surface 32 of the substrate 30. The bond coat 36 includes a deposited layer 38 and a diffusion zone 40 that is the result of interdiffusion of material from the deposited layer 38 with material from the substrate 30. The process that deposits the deposited layer 38 onto the surface 32 of the substrate 30 is performed at elevated temperature, so that during deposition the material of the deposited layer 38 interdiffuses into and with the material of the substrate 30, forming the diffusion zone 40. The diffusion zone 40, indicated by a dashed line in FIG. 2, is a part of the bond coat 36 but extends downward into the substrate 30. Although FIG. 2 is not drawn to scale, the relative thicknesses of the diffusion zone 40 and the deposited layer 38 depend upon the type of bond coat that is being employed. For diffusion aluminide bond coats, such as the preferred platinum aluminide, the diffusion zone 40 is relatively thicker. For overlay bond coats, such as MCrAlX bond coats, the diffusion zone 40 is relatively thinner.

The bond coat 36 has an outwardly facing bond coat surface 42 remote from the surface 32 of the substrate 30. An alumina (aluminum oxide, or $Al_2O_3$) scale 44 forms at this bond coat surface 42 by oxidation of the aluminum in the bond coat 36 at the bond coat surface 42. Other oxides such as chromium oxide may also be present, according to elements present in the bond coat 36. A ceramic thermal barrier coating 46 overlies and contacts the bond coat surface 42 and the alumina scale 44 thereon.

Figure 4:
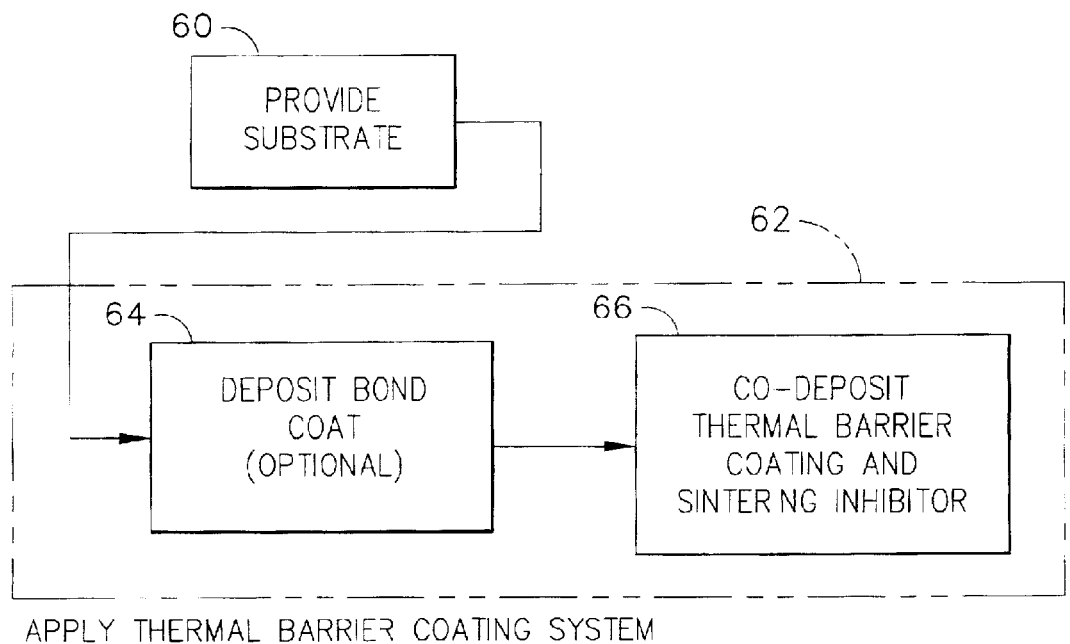
FIG. 4 is a block diagram illustrating a first preferred approach for preparing the article of FIG. 1.

FIG. 4 is a block flow diagram of one preferred approach for fabricating an article. An article and thence the substrate 30 are provided, numeral 60. The article is preferably a component of a gas turbine engine such as a gas turbine blade 20 or vane (or "nozzle", as the vane is sometimes called), see FIG. 1, but it may be other articles such as other components of gas turbine engines. The article may be a single crystal article, a preferentially oriented polycrystal, or a randomly oriented polycrystal. The article is preferably made of a nickel-base alloy, and most preferably made of a nickel-base superalloy. As used herein, "nickel-base" means that the composition has more nickel present than any other single element. The nickel-base superalloys are typically of a composition that is strengthened by the precipitation of gamma-prime phase or a related phase. The preferred nickel-base alloy has a composition, in weight percent, of from about 4 to about 20 percent cobalt, from about 1 to about 10 percent chromium, from about 5 to about 7 percent aluminum, from 0 to about 2 percent molybdenum, from about 3 to about 8 percent tungsten, from about 4 to about 12 percent tantalum, from 0 to about 2 percent titanium, from 0 to about 8 percent rhenium, from 0 to about 6 percent ruthenium, from 0 to about 1 percent niobium, from 0 to about 0.1 percent carbon, from 0 to about 0.01 percent boron, from 0 to about 0.1 percent yttrium, from 0 to about 1.5 percent hafnium, balance nickel and incidental impurities.

A most preferred alloy composition is René N5, which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities. Other operable superalloys include, for example, René N6, which has a nominal composition in weight percent of about 12.5 percent cobalt, about 4.2 percent chromium, about 1.4 percent molybdenum, about 5.75 percent tungsten, about 5.4 percent rhenium, about 7.2 percent tantalum, about 5.75 percent aluminum, about 0.15 percent hafnium, about 0.05 percent carbon, about 0.004 percent boron, about 0.01 percent yttrium, balance nickel and incidental impurities; Rene 142, which has a nominal composition, in weight percent, of about 12 percent cobalt, about 6.8 percent chromium, about 1.5 percent molybdenum, about 4.9 percent tungsten, about 6.4 percent tantalum, about 6.2 percent aluminum, about 2.8 percent rhenium, about 1.5 percent hafnium, about 0.1 percent carbon, about 0.015 percent boron, balance nickel and incidental impurities; CMSX-4, which has a nominal composition in weight percent of about 9.60 percent cobalt, about 6.6 percent chromium, about 0.60 percent molybdenum, about 6.4 percent tungsten, about 3.0 percent rhenium, about 6.5 percent tantalum, about 5.6 percent aluminum, about 1.0 percent titanium, about 0.10 percent hafnium, balance nickel and incidental impurities; CMSX-10, which has a nominal composition in weight percent of about 7.00 percent cobalt, about 2.65 percent chromium, about 0.60 percent molybdenum, about 6.40 percent tungsten, about 5.50 percent rhenium, about 7.5 percent tantalum, about 5.80 percent aluminum, about 0.80 percent titanium, about 0.06 percent hafnium, about 0.4 percent niobium, balance nickel and incidental impurities; PWA1480, which has a nominal composition in weight percent of about 5.00 percent cobalt, about 10.0 percent chromium, about 4.00 percent tungsten, about 12.0 percent tantalum, about 5.00 percent aluminum, about 1.5 percent titanium, balance nickel and incidental impurities; PWA1484, which has a nominal composition in weight percent of about 10.00 percent cobalt, about 5.00 percent chromium, about 2.00 percent molybdenum, about 6.00 percent tungsten, about 3.00 percent rhenium, about 8.70 percent tantalum, about 5.60 percent aluminum, about 0.10 percent hafnium, balance nickel and incidental impurities; and MX-4, which has a nominal composition as set forth in U.S. Pat. No. 5,482,789, in weight percent, of from about 0.4 to about 6.5 percent ruthenium, from about 4.5 to about 5.75 percent rhenium, from about 5.8 to about 10.7 percent tantalum, from about 4.25 to about 17.0 percent cobalt, from 0 to about 0.05 percent hafnium, from 0 to about 0.06 percent carbon, from 0 to about 0.01 percent boron, from 0 to about 0.02 percent yttrium, from about 0.9 to about 2.0 percent molybdenum, from about 1.25 to about 6.0 percent chromium, from 0 to about 1.0 percent niobium, from about 5.0 to about 6.6 percent aluminum, from 0 to about 1.0 percent titanium, from about 3.0 to about 7.5 percent tungsten, and wherein the sum of molybdenum plus chromium plus niobium is from about 2.15 to about 9.0 percent, and wherein the sum of aluminum plus titanium plus tungsten is from about 8.0 to about 15.1 percent, balance nickel and incidental impurities. The use of the present invention is not limited to these preferred alloys, and has broader applicability.

The thermal barrier coating system 34 is applied, numeral 62. The application of the thermal barrier coating system 34 optionally but desirably includes the deposition of the bond coat 36, numeral 64. The bond coat 36 is preferably a diffusion aluminide bond coat, produced by depositing an aluminum-containing layer onto the substrate 30 and interdiffusing the aluminum-containing layer with the substrate 30, resulting in the deposited layer 38 and the diffusion zone 40 shown in FIG. 2. The bond coat 36 may be a simple diffusion aluminide, or it may be a more-complex diffusion aluminide wherein another layer, such as a layer of a noble metal and preferably platinum, is first deposited upon the surface 32, and the aluminum-containing layer is deposited over the first-deposited layer. In either case, the aluminum-containing layer may be doped with other elements that modify the bond coat. The bond coat 36 may instead be an overlay coating such as an MCrAlX coating. The terminology "MCrAlX" is a shorthand term of art for a variety of families of overlay protective layers 46 that may be employed as environmental coatings or bond coats in thermal barrier coating systems. In this and other forms, M refers to nickel, cobalt, iron, and combinations thereof. In some of these protective coatings, the chromium may be omitted. The X denotes elements such as hafnium, zirconium, yttrium, tantalum, rhenium, ruthenium, palladium, platinum, silicon, titanium, boron, carbon, and combinations thereof. Specific compositions are known in the art. Some examples of MCrAlX compositions include, for example, NiAlCrZr and NiAlZr, but this listing of examples is not to be taken as limiting. The bond coat 36 typically is from about 0.0005 to about 0.010 inch thick. Such bond coats 36 are generally known in the art. The basic application procedures for the various types of bond coats are known in the art.

Because the platinum-aluminide diffusion aluminide is preferred as the bond coat 36, its deposition will be described in more detail. A platinum-containing layer is first deposited onto the surface 32 of the substrate 30. The platinum-containing layer is preferably deposited by electrodeposition. For the preferred platinum deposition, the deposition is accomplished by placing a platinum-containing solution into a deposition tank and depositing platinum from the solution onto the surface 32 of the substrate 30. An operable platinum-containing aqueous solution is $Pt(NH_3)_4HPO_4$ having a concentration of about 4–20 grams per liter of platinum, and the voltage/current source is operated at about ½–10 amperes per square foot of facing article surface. The platinum first coating layer, which is preferably from about 1 to about 6 micrometers thick and most preferably about 5 micrometers thick, is deposited in 1–4 hours at a temperature of 190–200° F.

A layer comprising aluminum and any modifying elements is deposited over the platinum-containing layer by any operable approach, with chemical vapor deposition preferred. In that approach, a hydrogen halide activator gas, such as hydrogen chloride, is contacted with aluminum metal or an aluminum alloy to form the corresponding aluminum halide gas. Halides of any modifying elements are formed by the same technique. The aluminum halide (or mixture of aluminum halide and halide of the modifying element, if any) contacts the platinum-containing layer that overlies the substrate 30, depositing the aluminum thereon. The deposition occurs at elevated temperature such as from about 1825° F. to about 1975° F. so that the deposited aluminum atoms interdiffuse into the substrate 30 during a 4 to 20 hour cycle.

As seen in FIGS. 2 and 3, when prepared by a physical vapor deposition process (to be described subsequently) the thermal barrier coating 46 is formed of a plurality of generally columnar grains 48 of the ceramic material that are affixed at their roots to the bond coat 36 and the alumina scale 44. The columnar grains 48 have grain surfaces 49. There are gaps 50 between the grains 48 and their grain surfaces 49. The gaps 50 are oriented at various angles relative to the surface 32 of the substrate 30.

This gap-containing morphology of the thermal barrier coating 46 is beneficial to the functioning of the thermal barrier coating. The gaps 50 allow the substrate 30, the bond coat 36, the alumina scale 44, and the thermal barrier coating 46 to expand in a transverse direction 52 that is locally parallel to the plane of the surface 32 and the bond coat 36. Absent the gaps 50, the in-plane thermal stresses (i.e., parallel to the transverse direction 52) that are induced in the thermal barrier coating 46 as the turbine blade 20 is heated and cooled are developed across the entire extent of the thermal barrier coating 46. The thermal barrier coating 46, being a ceramic, has a generally low ductility so that the accumulated stresses accelerate the onset of failure. With the gaps 50 present, as illustrated, the in-plane stresses in the thermal barrier coating 46 are developed across only one or at most a group of a few of the columnar grains 48. That is, all of the grains 48 have in-plane stresses, but the magnitude of the in-plane stresses are relatively low because the thermally induced strains do not accumulate over long distances. The result is that the thermal barrier coating 46 with the columnar grains 48 and gaps 50 is less likely to fail by in-plane overstressing during service. Additionally, the gaps 50 are filled with air, which when relatively stagnant between the grains 48 is an effective thermal insulator, aiding the thermal barrier coating 46 in performing its primary role.

During the exposure to elevated temperature of the turbine blade 20 in service, the facing grain surfaces 49 tend to grow toward each other, bond together, and sinter together. The size of the gap 50 is gradually reduced toward closure. The beneficial effects discussed above are thereby gradually reduced and eventually lost.

Figure 5:
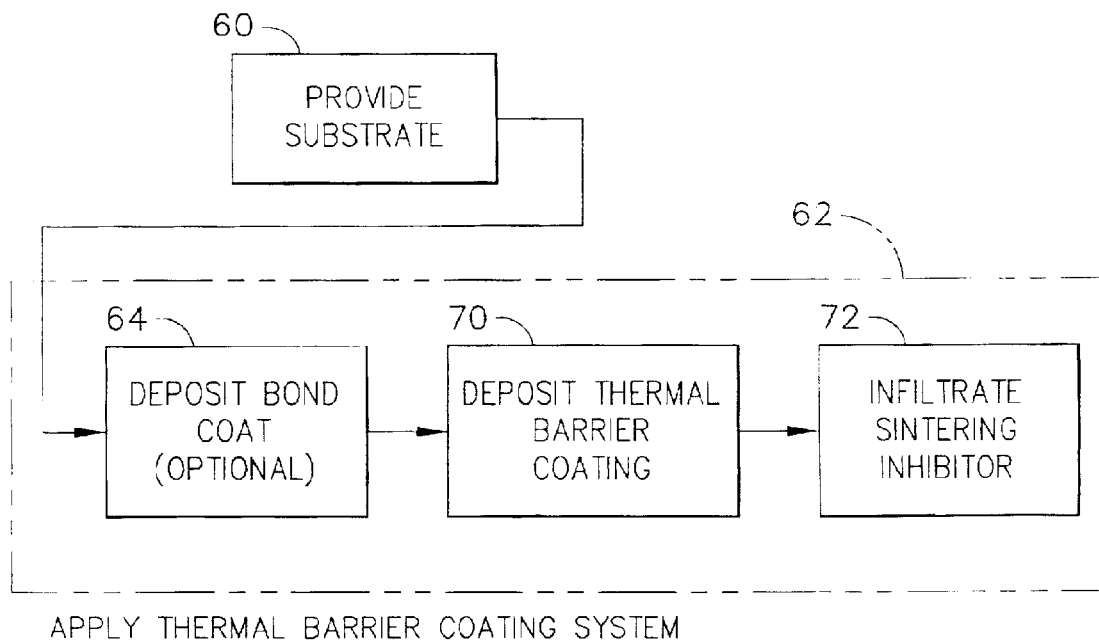
FIG. 5 is a block diagram illustrating a second preferred approach for preparing the article of FIG. 1.

Either of two approaches may be used to provide a sintering inhibitor that limits the sintering of the facing grain surfaces 49 of the columnar grains 48. FIG. 4 illustrates an approach where the thermal barrier coating and the sintering inhibitor are co-deposited, and FIG. 5 illustrates an approach where the thermal barrier coating is first deposited, and then the sintering inhibitor is thereafter infiltrated into the gaps of the thermal barrier coating.

In the approach of FIG. 4, the thermal barrier coating 46 and the sintering inhibitor are co-deposited, numeral 66, preferably by a physical vapor deposition process such as electron beam physical vapor deposition (EBPVD). The ceramic thermal barrier coating 46 is the major phase, and the sintering inhibitor is a minor phase distributed throughout the ceramic thermal barrier coating, with essentially uniform concentration. The ceramic thermal barrier coating 46 is preferably from about 0.003 to about 0.010 inch thick, most preferably about 0.005 inch thick. The ceramic thermal barrier coating 42 is preferably yttria-stabilized zirconia (YSZ), which is zirconium oxide containing from about 2 to about 12 weight percent, preferably from about 4 to about 8 weight percent, of yttrium oxide. Other operable ceramic materials may be used as well.

The sintering inhibitor is co-deposited with the thermal barrier coating 46. The sintering inhibitor is lanthanum oxide, lanthanum chromate, chromium oxide, and/or yttrium chromate, and mixtures thereof. The sintering inhibitor may also be a mixture of one or more of these ceramic species with aluminum oxide. The mixture of the ceramic species and aluminum oxide preferably comprises less than about 25 percent by weight of the total of the sintering inhibitor and the thermal barrier coating material. The sintering inhibitor may also be a modification of lanthanum chromate, chromium oxide, and/or yttrium chromate, wherein cobalt or manganese is substituted for at least some of the chromium. The sintering inhibitor may also be a precursor of any of these ceramic species, which react to produce the species. The sintering inhibitor may also be a reaction product of any of these ceramic species, produced by the reaction of the species with each other or with the base ceramic of the thermal barrier coating (which is preferably yttria-stabilized zirconia). As used herein, a "form" of a sintering inhibitor includes the named ceramics (lanthanum oxide, lanthanum chromate, chromium oxide, and/or yttrium chromate in this case), mixtures of these named ceramics, mixtures of these named ceramics with aluminum oxide, modifications of these named ceramics wherein cobalt or manganese is substituted for chromium, precursors of any of these species, and reaction products of any of these species.

These species are preferably also deposited by EBPVD, but from a separate source than is the YSZ. That is, the surface upon which the deposition occurs has two EBPVD sources facing it, from which deposition occurs simultaneously. One source deposits the YSZ, and the other source deposits the sintering inhibitor. Under some circumstances it may be possible to deposit the YSZ and the sintering inhibitor from the same source, but it is generally difficult to perform such depositing while maintaining coating uniformity at a steady state deposition rate. The multi-source approach is therefore preferred. The sintering inhibitor is preferably present in an amount of from about 1 to about 15 percent by weight of the total of the sintering inhibitor and the thermal barrier coating.

In the approach of FIG. 5, the steps 60 and 64 are as described above, and the prior description is incorporated here. After the bond coat 36 is optionally deposited, step 64, the thermal barrier coating 46 is deposited, numeral 70. The step 70 is like the previously described step 66, whose description is incorporated here, except that only the thermal barrier coating 46 is deposited—the sintering inhibitor is not deposited at this point.

After the thermal barrier coating 46 is deposited, numeral 70, with a morphology generally like that illustrated in FIGS. 2 and 3 and discussed above, the sintering inhibitor is infiltrated into the gaps 50 and deposited onto the grain surfaces 49, numeral 72. The approach of FIG. 5 provides for a sintering inhibitor within the columnar grains but having its highest concentration at the grain surfaces.

In a preferred approach for performing the infiltration 72, the sintering inhibitor, having a composition described above, is provided in a nonsolid (liquid or gaseous) form that can flow into the gaps 50. In one approach, the sintering inhibitor is provided as a liquid-soluble species, such as acetates, chlorides, or sulfates. The liquid-soluble species is dissolved in the appropriate solvent, such as water or an organic solvent. An example is an alkoxide in alcohol. Alternatively, a dispersor or a microemulsion or a sol may be used for infiltrates of the sintering inhibitor or its precursor. The thermal barrier coating 46 is contacted to the solution so that the solution penetrates into the gaps 50. The solvent is then removed by evaporation or other approach, leaving the sintering inhibitor at the surfaces 49 of the columnar grains 48. In another approach, the sintering inhibitor (or a precursor) is provided in a gaseous form for chemical vapor infiltration, such as combined with a gaseous organic constituent in a metal oxide chemical vapor deposition (MOCVD) process, and infiltrated into the gaps 50 to deposit on the surfaces 49 of the columnar grains 48.

Figure 6:
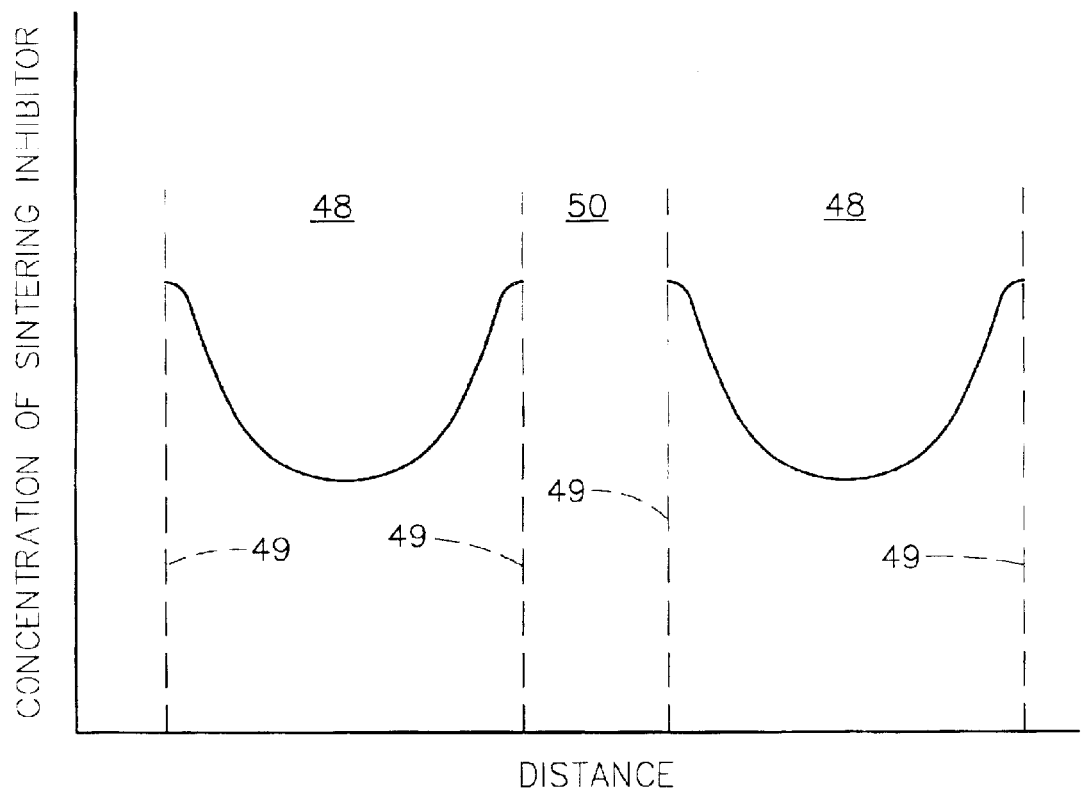
FIG. 6 is a schematic graph of the concentration of the sintering inhibitor as a function of position in the columnar grains of the thermal barrier coating in one embodiment.

The two approaches of FIGS. 4-5 may be used together, so that the co-deposition of FIG. 4 produces a general background level of the sintering inhibitor throughout the grains 48, and the surface-deposition approach of FIG. 5 produces a higher concentration at the grain surfaces 49. FIG. 6 is a schematic representation of the concentration of the sintering inhibitor as a function of position within the columnar grains 48 when this approach is used. The concentration of the sintering inhibitor reaction product is greatest at and near the surfaces 49, where it is most beneficially applied to inhibit sintering between the columnar grains 48, and decreases with increasing distance into the columnar grains 48 to the background level established by co-deposition.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An article protected by a thermal barrier coating system, comprising:

a substrate having a substrate surface; and a thermal barrier coating system overlying the substrate, the thermal barrier coating system comprising
a thermal barrier coating formed of a thermal barrier coating material arranged as a plurality of columnar grains extending generally perpendicular to the substrate surface and having grain surfaces, and a form of a sintering inhibitor within the columnar grains, wherein the thermal barrier coating material is a major phase, and the form of the sintering inhibitor is a minor phase distributed within the columnar grains or concentrated at the grain surfaces, and wherein the form of the sintering inhibitor is selected from the group consisting of lanthanum chromate, chromium oxide, and yttrium chromate, mixtures thereof, mixtures thereof with aluminum oxide, modifications thereof wherein cobalt or manganese is substituted for chromium, precursors thereof, and reaction products thereof.

2. The article of claim 1, wherein the substrate comprises a nickel-base superalloy.

3. The article of claim 1, wherein the substrate comprises a component of a gas turbine engine.

4. The article of claim 1, wherein the substrate comprises an article selected from the group consisting of a turbine blade, a turbine vane, a combustor fuel nozzle, and a combustor shield.

5. The article of claim 1, wherein the thermal barrier coating system further comprises
a bond coat disposed between the substrate and the thermal barrier coating.

6. The article of claim 5, wherein the bond coat is selected from the group consisting of a diffusion aluminide and an aluminum-containing overlay coating.

7. The article of claim 5, wherein the bond coat is a platinum aluminide.

8. The article of claim 1, wherein the thermal barrier coating comprises yttria-stabilized zirconia.

9. The article of claim 1, wherein the sintering inhibitor is concentrated at the grain surfaces.

10. The article of claim 1, wherein the form of the sintering inhibitor is constant concentration throughout the thermal barrier coating.

11. An article protected by a thermal barrier coating system, comprising:
a substrate having a substrate surface; and
a thermal barrier coating system overlying the substrate, the thermal barrier coating system comprising
a thermal barrier coating formed of a thermal barrier coating material arranged as a plurality of columnar grains extending generally perpendicular to the substrate surface and having grain surfaces, and
a form of a sintering inhibitor within the columnar grains, wherein the thermal barrier coating material is a major phase, and the form of the sintering inhibitor is a minor phase distributed within the columnar grains or concentrated at the grain surfaces, and wherein the form of the sintering inhibitor comprises a precursor of at least one of the group consisting of lanthanum oxide, lanthanum chromate, chromium oxide, and yttrium chromate.

12. An article protected by a thermal barrier coating system, comprising:

a substrate having a substrate surface; and
a thermal barrier coating system overlying the substrate, the thermal barrier coating system comprising
a thermal barrier coating formed of a thermal barrier coating material arranged as a plurality of columnar grains extending generally perpendicular to the substrate surface and having grain surfaces, and
a form of a sintering inhibitor within the columnar grains, wherein the thermal barrier coating material is a major phase, and the form of the sintering inhibitor is a minor phase distributed within the columnar grains of concentrated at the grain surfaces, wherein the form of the sintering inhibitor comprises at least one of the group consisting of lanthanum cheromate modified with cobalt or maganese substituted for at least some of the chromium, and yttrium chromate, modified with cobalt or manganese substituted for at least some of the chromium.

13. A method for fabricating an article protected by a thermal barrier coating system, comprising the steps of
providing a substrate having a substrate surface; and
applying a thermal barrier coating system overlying the substrate, the thermal barrier coating system comprising
a thermal barrier coating formed of a thermal barrier coating material arranged as a plurality of columnar grains extending generally perpendicular to the substrate surface and having grain surfaces, and
a sintering inhibitor within the columnar grains, the form of the sintering inhibitor being selected from the group consisting of lanthanum oxide, lanthanum chromate, chromium oxide, and yttrium chromate, mixtures thereof, mixtures thereof with aluminum oxide, modifications thereof wherein cobalt or manganese is substituted for chromium, precursors thereof, and reaction products thereof, wherein the step of applying includes the steps of
depositing the thermal barrier coating, and thereafter
infiltrating the form of the sintering inhibitor into the thermal barrier coating.

14. The method of claim 18, wherein the step of applying includes the steps of
co-depositing the thermal barrier coating and the sintering inhibitor.

15. The method of claim 13, wherein the step of infiltrating comprises the steps of
forming a solution containing the sintering inhibitor, and
contacting the solution to the thermal barrier coating.

16. The method of claim 13, wherein the step of applying a thermal barrier coating system includes the steps of
depositing a bond coat overlying the substrate, and thereafter
depositing the thermal barrier coating overlying the bond coat.

* * * * *

UNITED STATES PATENT AND TRADEMARK OFFICE
CERTIFICATE OF CORRECTION

PATENT NO. : 6,821,641 B2
DATED : November 23, 2004
INVENTOR(S) : Bruce et al.

It is certified that error appears in the above-identified patent and that said Letters Patent is hereby corrected as shown below:

<u>Column 8,</u>
Line 7, "deposited-the" should be -- deposited--the --.

<u>Column 9,</u>
Line 34, "wherein the" should be -- wherein the form of the --.
Line 37, "is constant" should be -- is of substantially constant --.

<u>Column 10,</u>
Line 12, "grains of concentrated" should be -- grains or concentrated --.
Line 15, "cheromate" should be -- chromate --.
Line 31, before "a sintering inhibitor" insert -- a form of --.
Line 43, "claim 18" should be -- claim 13 --.

Signed and Sealed this

Twenty-first Day of March, 2006

JON W. DUDAS
*Director of the United States Patent and Trademark Office*